United States Patent
Rothberg

(10) Patent No.: US 10,235,057 B2
(45) Date of Patent: Mar. 19, 2019

(54) OPERATING PARAMETERS FOR FLASH MEMORY DEVICES

(71) Applicant: HGST Netherlands B.V., Amsterdam (NL)

(72) Inventor: Michael Stephen Rothberg, Foothill Ranch, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 14/846,568

(22) Filed: Sep. 4, 2015

(65) Prior Publication Data

US 2017/0068468 A1    Mar. 9, 2017

(51) Int. Cl.
*G06F 3/06* (2006.01)
*G11C 16/34* (2006.01)
(Continued)

(52) U.S. Cl.
CPC ............ *G06F 3/0616* (2013.01); *G06F 3/061* (2013.01); *G06F 3/0634* (2013.01); *G06F 3/0659* (2013.01); *G06F 3/0679* (2013.01); *G06F 3/0688* (2013.01); *G06F 12/0246* (2013.01); *G11C 16/3495* (2013.01); *G06F 2212/1041* (2013.01); *G06F 2212/7204* (2013.01);
(Continued)

(58) Field of Classification Search
CPC ..... G06F 2212/1032; G06F 2212/1036; G06F 3/0688; G06F 2212/7208; G06F 2212/7211; G11C 11/5628; G11C 11/5635
See application file for complete search history.

(56) References Cited

U.S. PATENT DOCUMENTS 8,717,826 B1 *  5/2014  Gurgi ................... G11C 16/349
                                                  365/185.24
8,995,197 B1 *  3/2015  Steiner ............... G06F 12/0246
                                                  365/185.19
(Continued)

FOREIGN PATENT DOCUMENTS

JP    2005-044454 A    2/2005
JP    2010-015516 A    1/2010
JP    2012-203692 A    10/2012

OTHER PUBLICATIONS

UK Search and Examination Report dated Jan. 31, 2017, which issued in Application No. GB1615002.1.
(Continued)

*Primary Examiner* — Michael Alsip
*Assistant Examiner* — Andrew Russell
(74) *Attorney, Agent, or Firm* — Morgan, Lewis & Bockius LLP

(57) ABSTRACT

A machine-implemented method for managing a flash storage system includes determining a projected life value for each of a plurality of flash memory devices in the flash storage system, wherein the projected life value for at least one of the plurality of flash memory devices is higher than the projected life value of at least another one of the plurality of flash memory devices. The method also includes determining operating parameters for each of the plurality of flash memory devices based on the respective projected life values for the plurality of flash memory devices. The method also includes configuring the plurality of flash memory devices based on the determined operating parameters.

18 Claims, 3 Drawing Sheets

(51) Int. Cl.
  *G06F 12/02* (2006.01)
  *G11C 16/10* (2006.01)
  *G11C 16/16* (2006.01)

(52) U.S. Cl.
  CPC .......... *G06F 2212/7206* (2013.01); *G06F 2212/7208* (2013.01); *G06F 2212/7211* (2013.01); *G11C 16/10* (2013.01); *G11C 16/16* (2013.01)

(56) References Cited

U.S. PATENT DOCUMENTS

| | | | | |
|---|---|---|---|---|
| 2009/0273977 | A1* | 11/2009 | Kim | G11C 11/5621 365/185.11 |
| 2011/0047421 | A1* | 2/2011 | Schuette | G11C 16/349 714/718 |
| 2012/0216085 | A1* | 8/2012 | Weingarten | G11C 16/349 714/718 |
| 2012/0239858 | A1* | 9/2012 | Melik-Martirosian | G11C 16/349 711/103 |
| 2012/0243329 | A1* | 9/2012 | Nagashima | G11C 16/10 365/185.22 |
| 2013/0033933 | A1* | 2/2013 | Park | G11C 11/5642 365/185.03 |
| 2013/0227200 | A1* | 8/2013 | Cometti | G06F 12/0246 711/103 |
| 2014/0029351 | A1* | 1/2014 | Mu | G11C 16/3418 365/185.22 |
| 2014/0040681 | A1 | 2/2014 | Wolfman et al. | |
| 2015/0186055 | A1* | 7/2015 | Darragh | G06F 3/0616 711/103 |

OTHER PUBLICATIONS

Korean Office Action from Korean Patent Application No. 10-2016-0113810, dated Aug. 29, 2017, 12 pages.
Australian Examination Report from Australian Patent Application No. 2016225780, dated Jul. 27, 2017, 4 pages.
Canadian Office Action from Canadian Patent Application No. 2,941,170, dated Aug. 15, 2017.
Japanese Office Action from Japanese Patent Application No. 2016-172658 dated Nov. 14, 2017, 11 pages.
Korean Office Action from Korean Patent Application No. 10-2016-0113810, dated Jul. 12, 2018, 5 pages.
Examination Report No. 2 from Australian Patent Application No. 2016225780, dated Jul. 16, 2018, 3 pages.
Canadian Office Action from Canadian Patent Application No. 2941170, dated Jul. 30, 2018, 5 pages.

* cited by examiner

OPERATING PARAMETERS FOR FLASH MEMORY DEVICES

BACKGROUND

The present disclosure concerns flash storage systems and, more particularly, optimized operating parameters for flash memory devices.

Flash storage systems, such as solid-state drives (SSDs), use flash memory as a non-volatile storage medium. A flash storage system may include multiple flash memory devices. The flash memory devices are programmed (e.g., written to) as data is stored, and erased when space on the flash memory devices is freed. A flash memory device has a limited number of program/erase (P/E) cycles the flash memory device can withstand before becoming unusable. Programming voltages and other operating parameters may further affect the number of P/E cycles the flash memory device can withstand before failing.

SUMMARY

The subject technology optimizes operating parameters in a flash storage system by determining the operating parameters based on a projected life value for the flash memory device. The projected life value may be determined through testing the flash memory device.

According to aspects of the subject technology, a machine-implemented method for managing a flash storage system is provided. The method includes determining a projected life value for each of a plurality of flash memory devices in the flash storage system, wherein the projected life value for at least one of the plurality of flash memory devices is higher than the projected life value of at least another one of the plurality of flash memory devices. The method also includes determining operating parameters for each of the plurality of flash memory devices based on the respective projected life values for the plurality of flash memory devices. The method also includes configuring the plurality of flash memory devices based on the determined operating parameters.

According to other aspects of the subject technology, a flash storage system is provided. The flash storage system includes a plurality of flash memory devices and a controller. Each of the plurality of flash memory devices has a projected life value, wherein the projected life value for at least one of the plurality of flash memory devices is higher than the projected life value for at least another one of the plurality of flash memory devices. The controller is configured receive a command for a data operation. The controller is also configured to determine operating parameters for one of the plurality of flash memory devices having a flash memory block associated with the data operation, wherein the operating parameters are determined based on the respective projected life value for the one of the plurality of flash memory devices. The controller is also configured to configure the one of the plurality of flash memory devices based on the determined operating parameters. The controller is also configured to execute the data operation on the one of the plurality of flash memory devices.

According to other aspects of the subject technology, a machine-readable media is encoded with executable instructions which, when executed by a processor, cause the processor to perform operations. The operations include receiving a command for a data operation. The operations also include determining operating parameters for one of a plurality of flash memory devices having a flash memory block associated with the data operation, wherein each of the plurality of flash memory devices has a projected life value, wherein at least two of the plurality of flash memory devices have different projected life values, wherein the operating parameters are determined based on the respective projected life value for the one of the plurality of flash memory devices. The operations also include configuring the one of the plurality of flash memory devices based on the determined operating parameters. The operations also include executing the data operation on the one of the plurality of flash memory devices.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology may be practiced without these specific details. In some instances, structures and components are shown in block diagram form in order to avoid obscuring the concepts of the subject technology.

A flash storage system such as a solid-state drive (SSD) includes one or more flash memory devices, each of which may comprise one or more dies. Each flash memory device or die comprises an array of flash memory cells. Each memory cell includes a floating gate transistor that is used to store one or more bits of data. The flash memory cells may be organized into physical blocks, with each physical block comprising a number of pages. Data is written to flash memory in write units of pages. Data is erased from flash memory in erase units of physical blocks. Each P/E cycle may physically degrade or wear down the flash memory device such that each flash memory device has a finite number of P/E cycles before the wear deteriorates the integrity and reliability of storage.

The flash memory device is programmed or erased by applying a voltage to the appropriate floating gate transistors of the memory cells of the flash memory device. The performance of the flash memory device may be improved (e.g., faster write and/or erase speeds) by applying a higher initial voltage (e.g., increasing an initial pulse value), increasing the applied voltage at a faster rate (e.g., increasing an incremental pulse value), or applying the voltage for a longer duration (e.g., increasing a pulse width). However, the higher performance may cause faster degradation of the flash memory device, such that the life of the flash memory device decreases. Conversely, lowering the performance of the flash memory device may increase the life of the flash memory device. By determining a projected life value for a flash memory device, the performance of the flash memory device may be adjusted for a desired usage.

Figure 1:
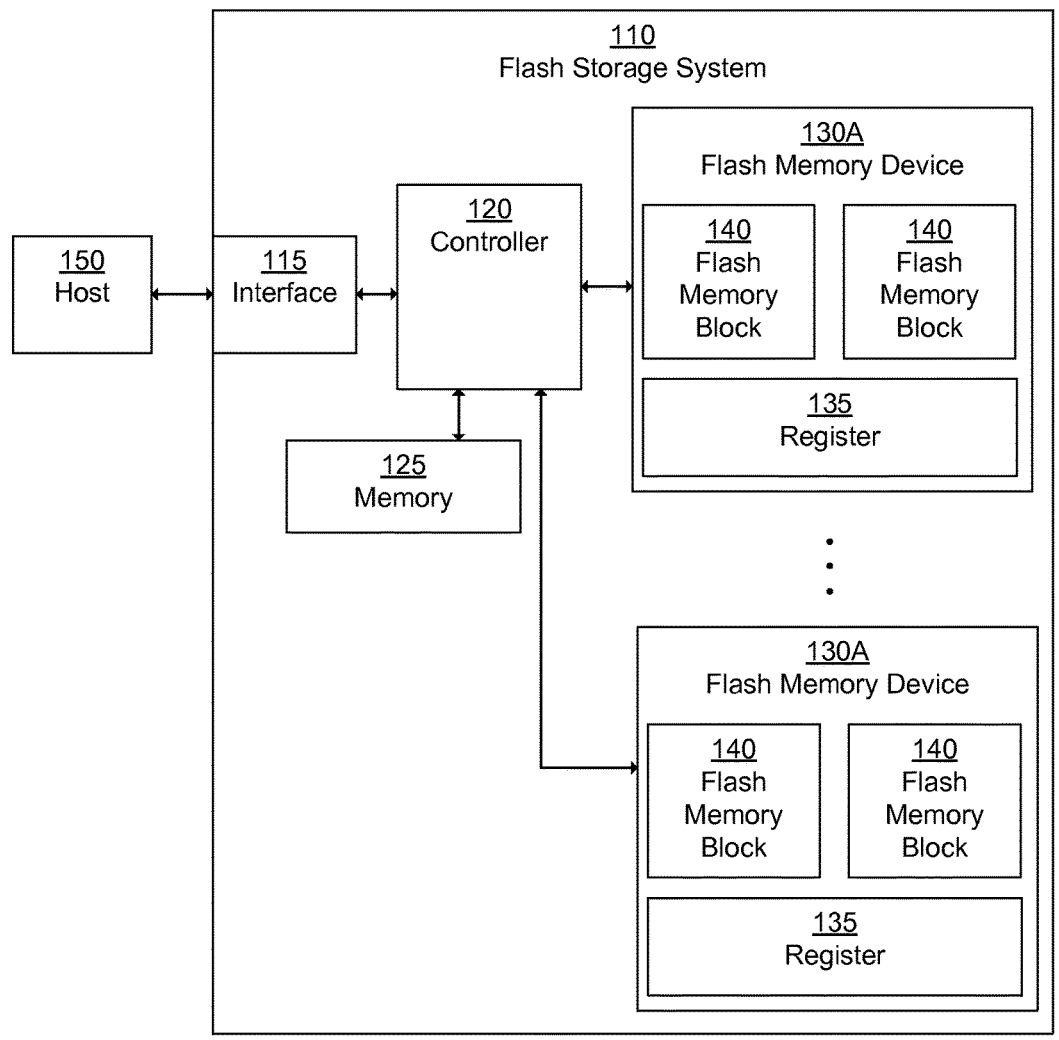
FIG. 1 is a block diagram illustrating components of a flash storage system according to aspects of the subject technology.

FIG. 1 is a block diagram illustrating components of a flash storage system 110 according to aspects of the subject technology. As depicted in FIG. 1, the flash storage system 110 includes an interface 115, a controller 120, a flash memory device 130A and a flash memory device 130B (collectively flash memory devices 130), and a memory 125. The interface 115 facilitates communication of data, commands, and/or control signals between the flash storage system 110 and a host 150. The controller 120 controls the operation of the flash storage system 110 to store and retrieve data in the flash memory devices 130 in accordance with commands received from the host 150. The controller 120 may include a processor. The memory 125, which may be a random access memory (RAM), provides temporary storage space for the controller 120 to process commands and transfer data between the host 150 and the flash memory devices 130. The operation of each of these components is described in more detail below.

The interface 115 provides physical and electrical connections between the host 150 and the flash storage system 110. The interface 115 is configured to facilitate communication of data, commands, and/or control signals between the host 150 and the flash storage system 110 via the physical and electrical connections. The connection and the communications with the interface 115 may be based on a standard interface such as Universal Serial Bus (USB), Small Computer System Interface (SCSI), Serial Advanced Technology Attachment (SATA), etc. Alternatively, the connection and/or communications may be based on a proprietary interface, although the subject technology is not limited to any particular type of interface.

The controller 120 manages the flow of data between the host 150 and the flash memory devices 130. The controller 120 is configured to receive commands and data from the host 150 via the interface 115. For example, the controller 120 may receive data and a write command from the host 150 to write the data in the flash memory devices 130. The controller 120 is further configured to send data to the host 150 via the interface 115. For example, the controller 120 may read data from the flash memory devices 130 and send the data to the host 150 in response to a read command. The controller 120 is further configured to manage data stored in the flash memory devices 130 and the memory 125 based on internal control algorithms or other types of commands that may be received from the host 150. For example, the controller 120 is configured to perform data operations such as garbage collection (GC) and other maintenance operations. Those skilled in the art will be familiar with other conventional operations performed by a controller in a flash storage device, which will not be described in detail herein.

The controller 120 may be implemented with a general purpose processor, micro-controller, digital signal processor (DSP), a system-on-a-chip (SoC), an application specific integrated circuit (ASIC), a field programmable gate array (FPGA) or other programmable logic device, discrete gate or transistor logic device, discrete hardware components, or any combination thereof designed and configured to perform the operations and functions described herein. The controller 120 may perform the operations and functions described herein by executing one or more sequences of instructions stored on a machine/computer readable medium. The machine/computer readable medium may be the flash memory devices 130, the memory 125, or other types of media from which the controller 120 can read instructions or code. For example, flash storage system 110 may include a read only memory (ROM), such as an EPROM or EEPROM, encoded with firmware/software comprising one or more sequences of instructions read and executed by the controller 120 during the operation of the flash storage system 110.

The flash memory devices 130 may each be a single flash memory chip or die or may represent groups of multiple flash memory chips. The flash memory devices 130 may be organized among multiple channels through which data is read from and written to the flash memory devices 130 by the controller 120, or coupled to a single channel. The flash memory devices 130 may be implemented using NAND flash. The flash memory devices 130 may each comprise a register 135, which may be one or more registers for storing specific data, such as characteristics and/or operating parameters of the respective flash memory devices 130. The operating parameters may include write and/or erase operation parameters such as initial pulse value, incremental pulse value, and pulse width.

The flash memory devices 130 comprise multiple memory cells divided into storage blocks such as flash memory blocks 140. Although FIG. 1 shows the flash memory devices 130 each having two flash memory blocks 140, the flash memory devices 130 may have more or less flash memory blocks 140, and the flash memory devices 130 may each have the same or different numbers of flash memory blocks 140. The flash memory blocks 140 may be referred to as data blocks or memory blocks and are addressable by the controller 120 using a physical block address. Each of the flash memory blocks 140 is further divided into multiple data segments or pages addressable by the controller 120 using a physical page address or offset from a physical block address of the storage block containing the referenced page. The pages may store sectors or other host data units. The flash memory blocks 140 represent the units of data that are erased within the flash memory devices 130 in a single erase operation. The physical pages represent the units of data that are read from or written to the flash memory devices 130 in a single read or write operation. Although the flash memory devices 130 are described in terms of blocks and pages, other terminology may be used to refer to these data units within a flash storage device.

The subject technology is not limited to any particular capacity of flash memory. For example, storage blocks may each comprise 32, 64, 128, or 512 pages. Additionally, pages may each comprise 512 bytes, 2 KB, 4 KB, or 32 KB. The sectors may each comprise 4 KB, or other sizes such that sectors may be the same size as a page, or there may be multiple sectors per page.

In FIG. 1, the memory 125 represents a volatile memory coupled to and used by the controller 120 during operation of the flash storage system 110. The controller 120 may buffer commands and/or data in the memory 125. The controller 120 also may use the memory 125 to store address mapping tables or lookup tables used to convert logical data addresses used by the host 150 into virtual and/or physical addresses corresponding to portions of the flash memory devices 130. Other types of tables, data, status indicators, etc. used to manage flash storage devices also may be stored in the memory 125 by the controller 120. For example, characteristics and/or parameters of the flash memory devices 130 may be stored in the memory 125. The memory 125 may be implemented using dynamic random access memory (DRAM), static random access memory (SRAM), or other types of volatile random access memory without departing from the scope of the subject technology.

The host 150 may be a computing device, such as a computer/server, a smartphone, or any other electronic device which reads data from and writes data to the flash storage system 110. The host 150 may have an operating system or other software that issues read and write commands to the flash storage system 110. The flash storage system 110 may be integrated with the host 150 or may be external to the host 150. The flash storage system 110 may be wirelessly connected to the host 150, or may be physically connected to the host 150.

The controller 120 is configured to perform data operations on the flash memory devices 130. For example, the controller 120 may determine that GC is necessary on one of the flash memory blocks 140. A flash memory block 140 may be selected for GC based on a wear leveling scheme. Because of the limited P/E cycles of flash memory devices, using a specific flash memory device more often than other flash memory devices may cause that specific flash memory device to fail before the other flash memory devices.

The controller 120 may keep track of the P/E cycle count of each flash memory block 140 for wear leveling purposes. In an even wear leveling scheme, flash memory blocks 140 having the lowest P/E cycle count are generally selected to evenly distribute the wear from P/E cycles. The even wear leveling scheme generally does not consider projected life values of the flash memory devices, and operates on the assumption that the flash storage system 110 generally comprises flash memory devices having similar projected life values. The projected life value may correspond to a number of P/E cycles expected to be performed on the flash memory blocks of the flash memory device before failure of the flash memory blocks.

Projected life values, such as the P/E cycle expectancies, for flash memory devices are often determined by the manufacturers of the flash memory devices. For example, a manufacturer may select a small sample of dies from a batch of manufactured dies for testing. The testing may involve applying a voltage to erase flash memory cells on the sample die. Specifically, the testing may involve applying the lowest voltage for the shortest pulse widths until the flash memory cells are considered to be erased. Based on the test, the manufacturer may rate the tested batch with an average projected life value, such as 30,000 P/E cycles. Although the average projected life value for each die in the batch may be rated the same, the actual life value for each die may greater than or less than the average projected life value determined through this test.

The flash storage system 110 may comprise flash memory devices 130 having the same or similar average projected life values based on the batch testing. However, each individual flash memory device 130 may have an actual life value above or below the average projected life value. If one or more flash memory devices 130 has an actual life value below the average projected life value, the one or more flash memory devices 130 may fail before reaching the average projected life.

In addition, a flash storage system may be rated or classified based on the projected life values for the flash memory devices in the flash storage system. Flash memory devices having high P/E cycle expectancies may be expected to have a long life for use in an enterprise storage system, or may be used in a high performance system which sacrifices long life for faster program/erase speeds. Flash memory devices having low P/E cycle expectancies may be used in low performance systems with lower life expectancies or slower speeds. More accurate ratings may be determined with more accurate projected life values.

To determine more accurate projected life values, each flash memory device may be tested. The flash memory devices may be tested before assembly, or may be tested after being installed in a flash storage system. One or more blocks in each flash memory device may be tested, which may render the tested block unusable. However, flash memory devices may be manufactured with extra blocks to account for block failures or use in maintenance operations. To reduce the effects of location variation within the blocks, the same blocks on the same locations on each flash memory device may be tested.

Performing the low voltage test, summarized above, on each flash memory device may be time consuming and therefore may not always be feasible. Rather than using the lowest voltage, a maximum voltage may be used for a maximum voltage test. During the maximum voltage test, the maximum voltage, which may be a maximum voltage controllable by the flash memory device, may be applied for long durations and/or multiple pulses in order to speed up charge capture in the cells of the block, reaching a saturation point. In addition, rather than waiting for a cool off period between pulses, the pulses may be applied consecutively, which may further speed the time to reach the saturation point. The voltage parameters used in the maximum voltage test—which may include a number of pulses at the maximum voltage needed to reach saturation or a voltage duration to reach saturation—may be measured and used to determine a more accurate projected life value than the average projected life value. For example, empirical data may be collected from performing the maximum voltage test to various flash memory devices to correlate the voltage parameters to expected P/E cycle counts.

Using these projected life values, flash memory devices may be better matched for use in flash storage systems. Alternatively, flash storage systems may be assembled before the projected life values for each flash memory device is tested. The projected life values may better determine a performance tier of the flash storage system. For instance, if the projected life values of the flash memory devices of a flash storage system are generally all higher or all lower than expected based on the average projected life value (which may have been used for the initial assembly of the flash storage system), the flash storage system may be rated a higher tier or lower tier accordingly.

The operating parameters of the flash memory devices may be adjusted from default values in order to achieve desired performance and/or lifespan for a flash storage system. For example, if the flash storage system included flash memory devices having projected life values greater than the average projected life value, the operating parameters of the flash memory devices may be adjusted to increase performance, resulting in a higher performance flash storage system. However, the increased performance may increase wear in the flash storage system, which may reduce the life of the flash storage system. The adjustment of the operating parameters for each flash memory device may be based on the corresponding projected life value, such that the reduced life does not fall below the original average projected life value.

Conversely, if all the flash memory devices have lower projected life values than the average projected life value, the operating parameters for each flash memory device may be adjusted to increase the life to the average projected life value, at the cost of performance. If the flash memory devices of flash storage system has projected life values above and below the average projected life value, the operating parameters of the flash memory devices having projected life values below the average projected life value may be adjusted to increase the life up to the average projected life value, and the operating parameters of the flash memory devices having projected life values above the average projected life value may be adjusted for increased performance to offset the reduced performance of the other flash memory devices.

Figure 2:
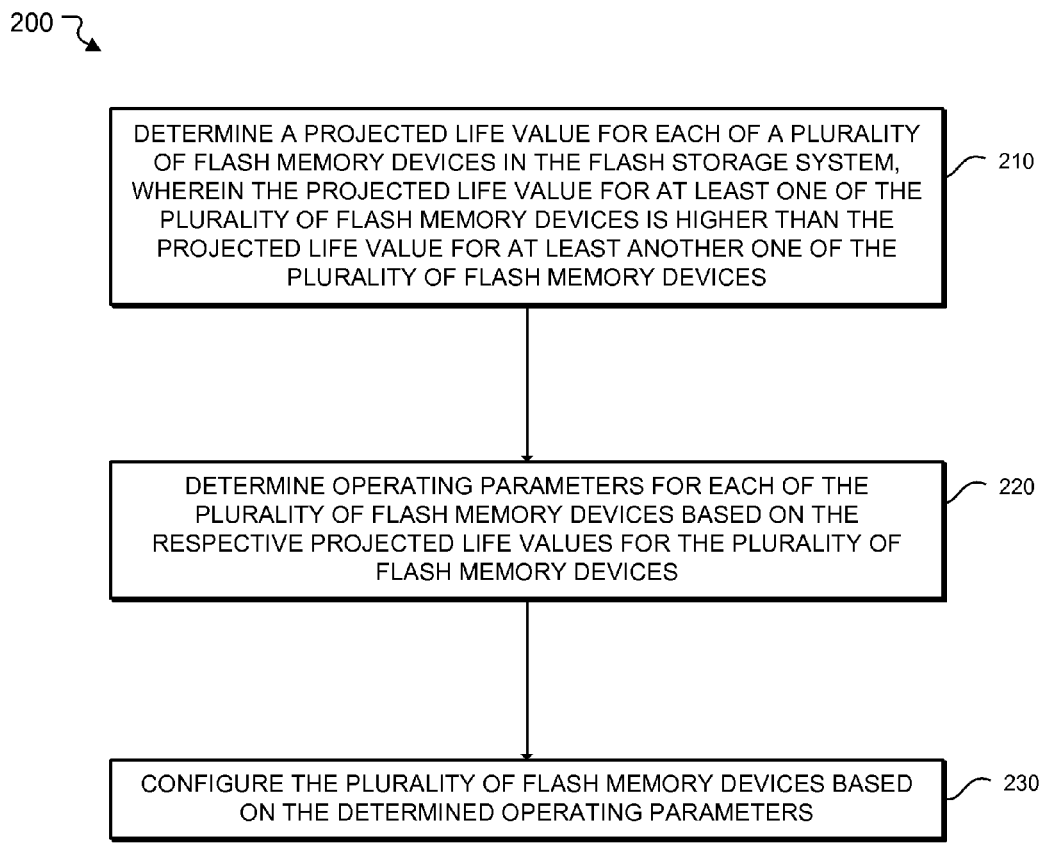
FIG. 2 is a flowchart illustrating a method for managing a flash storage system according to aspects of the subject technology.

FIG. 2 shows a flowchart 200 for an exemplary process for optimizing operating parameters according to aspects of the subject technology. The process of FIG. 2 may be performed during a manufacturing or testing stage of a flash storage device, or may be performed during an initialization sequence of the flash storage device. At 210, a projected life value for each of a plurality of flash memory devices in the flash storage system is determined, wherein the projected life value for at least one of the plurality of flash memory devices is higher than the projected life value for at least another one of the plurality of flash memory devices. In the flash storage system 110, the projected life value for a respective flash memory device 130 may be associated with each flash memory block 140 on the respective flash memory device 130. The projected life value may correspond to a number of P/E cycles expected to be performed on the flash memory blocks 140 in the corresponding flash memory device 130 before failure of the flash memory block 140 in the corresponding flash memory device 130. Although the flash memory devices may have been selected based on similar average projected life values, individual testing may reveal variations in the projected life values for each flash memory device. In FIG. 1, the flash memory device 130A may have a higher projected life value than the projected life value of the flash memory device 130B.

The projected life values may be determined through individual die testing such that the projected life value is based on a test value measured from a test flash memory block in each flash memory device. Empirical data from lab testing or simulations may provide data which correlates operating parameters to life values. The projected life values may be stored, for instance, in a designated flash memory block 140 on each flash memory device 130, such as in one or more tables. Alternatively, the projected life values may be stored in the registers 135 on each flash memory device 130, or stored in the memory 125.

At 220, operating parameters for each of the plurality of flash memory devices is determined based on the respective projected life values for the plurality of flash memory devices. The operating parameters may include write operation parameters and erase operation parameters. For example, the operating parameters may be adjusted from default operating parameter values to increase performance when the projected life value is higher than originally expected. One or more of an initial pulse value, incremental pulse value, and pulse width may be increased to speed up write or erase operations. The operating parameters for each of the flash memory devices may be different. The difference may correspond to a difference between the projected life values for each of the flash memory devices. In FIG. 1, the operating parameters for the flash memory device 130A may be adjusted to increase performance while reducing the extended life of the flash memory device 130A, and the operating parameters for the flash memory device 130B may be adjusted to decrease performance to extend the shorter life of the flash memory device 130B. The flash storage system 110 may average out in life and performance.

At 230, the plurality of flash memory devices is configured based on the determined operating parameters. The configuring may comprise storing the operating parameters in respective registers or designated flash memory blocks of the flash memory devices. In FIG. 1, the controller 120 may store the operating parameters in a designated flash memory block 140 and/or the register 135 of each flash memory device 130.

Figure 3:
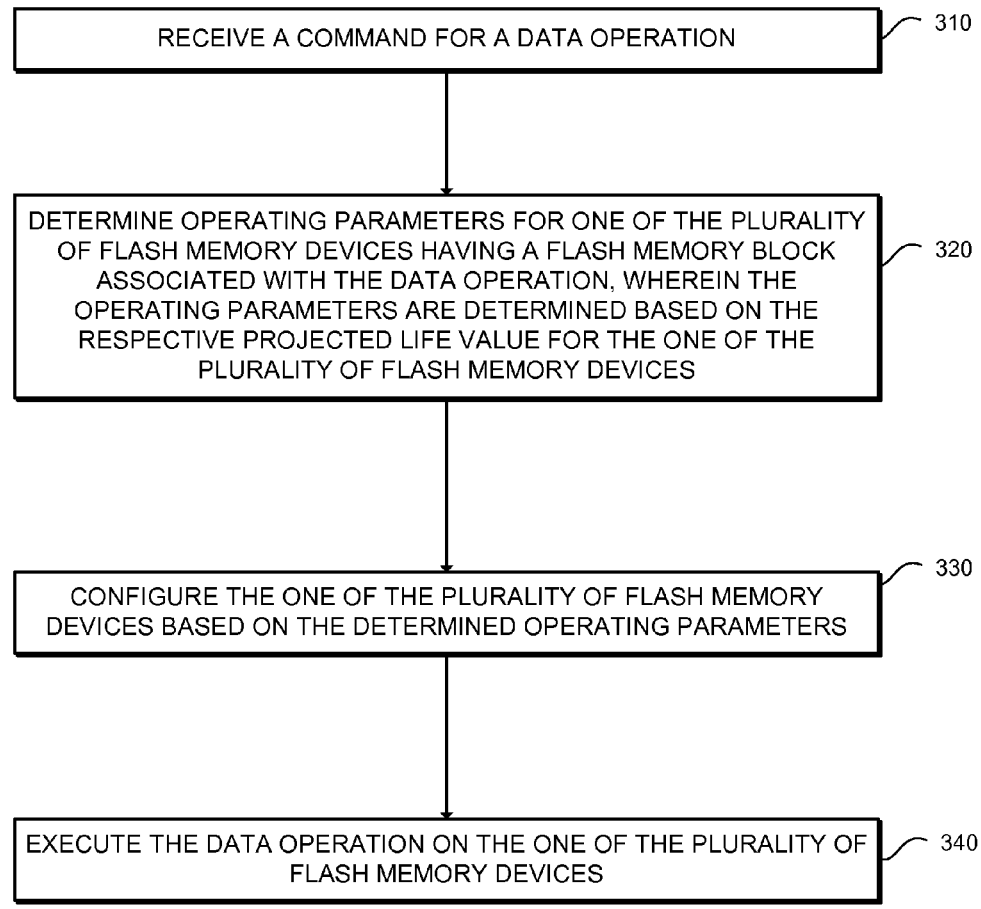
FIG. 3 is a flowchart illustrating another method for managing a flash storage system according to aspects of the subject technology.

FIG. 3 shows a flowchart 300 of another exemplary process for optimizing operating parameters according to aspects. The process of FIG. 3 may be performed by a controller of a flash storage system, for example, during operation of the flash storage system. The flash storage system includes a plurality of flash memory devices, each flash memory device having a projected life value, and wherein the projected life value for at least one of the plurality of flash memory devices is higher than the projected life value for at least another of the plurality of flash memory devices.

At 310, a command for a data operation is received. The controller 120 may receive a read, write, or erase command from the host 150, such as a write operation to write host data from the host 150 to a flash memory block 140. Alternatively, the command may be for a maintenance operation to be performed by the controller 120, such as a GC process to reclaim invalid memory locations in a flash memory block 140.

At 320, operating parameters are determined for one of a plurality of flash memory devices having a flash memory block associated with the data operation, wherein the operating parameters are determined based on the respective projected life value for the one of the plurality of flash memory devices. In FIG. 1, the controller 120 may select a flash memory device 130 based on a flash memory block 140 selected for the data operation. The controller 120 may read values stored in a data structure, such as a table, which may be stored on a designated flash memory block 140 or the register 135 of the selected flash memory device 130 to determine the operating parameters.

At 330, the one of the plurality of flash memory devices is configured based on the determined operating parameters. In FIG. 1, the controller 120 may configure the selected flash memory device 130 by adjusting voltage parameters for the data operation based on the determined operating parameters.

At 340, the data operation is executed on the one of the plurality of flash memory devices. After the controller 120 selects a flash memory block 140 at 320 and configures the flash memory device 130 having the flash memory block 140 at 330, the controller 120 may perform the data operation on the flash memory block 140 by applying the program/erase parameter based on the determined operating parameters. The data operation may be a write operation, a GC process or other maintenance operation. For each flash memory device 130, the controller may apply program/erase parameters based on the corresponding operating parameters.

In addition, the operating parameters may be changed as the flash memory device ages. The flash memory device may be configured for faster performance at the start of the life of the flash memory device, and gradually configured for slower performance as the flash memory device ages, in order to preserve remaining P/E cycles. For example, as the life of flash memory device reaches one or more milestones, the operating parameters may change. When new, the flash memory device may be configured with a first set of operating parameters. At the first milestone, such 10,000 P/E cycles or 30% of life used, the flash memory device may be configured with a second set of operating parameters, which may correspond to reduced performance than the first set of operating parameters. Alternatively, the operating parameters of the flash memory device may be continuously adjusted.

In addition, the operating parameters may be adjusted due to other factors, such as if a flash memory device prematurely fails, the other flash memory devices may be adjusted for higher performance to offset the loss of performance from the failed flash memory device, or adjusted for longer life to prevent further premature failures. In certain implementations, the operating parameters may be manually overwritten.

The various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. The described functionality may be implemented in varying ways for each particular application. Various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as a "configuration" does not imply that such configuration is essential to the subject technology or that such configuration applies to all configurations of the subject technology. A disclosure relating to a configuration may apply to all configurations, or one or more configurations. A phrase such a configuration may refer to one or more configurations and vice versa.

The word "exemplary" is used herein to mean "serving as an example or illustration." Any aspect or design described herein as "exemplary" is not necessarily to be construed as preferred or advantageous over other aspects or designs.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise" as "comprise" is interpreted when employed as a transitional word in a claim.

What is claimed is:

1. A machine-implemented method for managing a flash storage system, comprising:
   determining a projected life value for each of a plurality of flash memory devices in the flash storage system, wherein the projected life value for at least one of the plurality of flash memory devices is higher than the projected life value of at least another one of the plurality of flash memory devices, wherein the projected life value for each of the plurality of flash memory devices is based on a number of voltage pulses applied at a maximum voltage controllable by the plurality of flash memory devices for cells of a respective test flash memory block in each of the plurality of flash memory devices to reach a saturation point;
   determining an average projected life value based on the projected life value for each of the plurality of flash memory devices in the flash storage system;
   determining operating parameters for each of the plurality of flash memory devices based on a comparison of the average projected life value and the respective projected life values for the plurality of flash memory devices; and
   configuring the plurality of flash memory devices based on the determined operating parameters.

2. The machine-implemented method for managing a flash storage system according to claim 1, wherein the operating parameters for the at least one of the plurality of memory devices are different from the operating parameters for the at least another one of the plurality of flash memory devices.

3. The machine-implemented method for managing a flash storage system according to claim 2, wherein the difference in the operating parameters corresponds to a difference between the projected life value for the at least one of the plurality of memory devices and the projected life value of the at least another one of the plurality of flash memory devices.

4. The machine-implemented method for managing a flash storage system according to claim 1, wherein the operating parameters comprise erase operation parameters for erasing data units in the plurality of flash memory devices, and
wherein the erase operation parameters comprise at least one of initial pulse value, incremental pulse value, or pulse width.

5. The machine-implemented method for managing a flash storage system according to claim 1, wherein the operating parameters comprise write operation parameters for writing data to data units in the plurality of flash memory devices, and
wherein the write operation parameters comprise at least one of initial pulse value, incremental pulse value, or pulse width.

6. The machine-implemented method for managing a flash storage system according to claim 1, wherein the projected life value for a respective flash memory device is associated with each flash memory block on the respective flash memory device, and
wherein the projected life value is a number of program-erase cycles expected to be performed on flash memory blocks in the corresponding flash memory device before failure of the flash memory blocks in the corresponding flash memory device.

7. A flash storage system, comprising:
a plurality of flash memory devices, each of the plurality of flash memory devices having a projected life value, wherein at least two of the plurality of flash memory devices have different projected life values; and
a controller configured to:
receive a command for a data operation;
determine operating parameters for one of the plurality of flash memory devices having a flash memory block associated with the data operation, wherein the operating parameters are determined based on a comparison of the respective projected life value for the one of the plurality of flash memory devices and an average projected life value determined based on the projected life values of the plurality of flash memory devices, wherein the projected life value for the one of the plurality of flash memory devices is based on a number of voltage pulses applied at a maximum voltage controllable by the one of the plurality of flash memory devices for cells of a test flash memory block in the one of the plurality of flash memory devices to reach a saturation point;
configure the one of the plurality of flash memory devices based on the determined operating parameters; and
execute the data operation on the one of the plurality of flash memory devices.

8. The flash storage system according to claim 7, wherein each of the plurality of flash memory devices has operating parameters, wherein the at least two of the plurality of flash memory devices have different operating parameters and wherein the at least two of the plurality of flash memory devices include the one of the plurality of flash memory devices.

9. The flash storage system according to claim 8, wherein the difference in the operating parameters corresponds to a difference between the respective projected life values for the at least two of the plurality of memory devices.

10. The flash storage system according to claim 7, wherein the operating parameters comprise erase operation parameters for erasing data units in the plurality of flash memory devices, and
wherein the erase operation parameters comprise at least one of initial pulse value, incremental pulse value, or pulse width.

11. The flash storage system according to claim 7, wherein the operating parameters comprise write operation parameters for writing data to data units in the plurality of flash memory devices, and
wherein the write operation parameters comprise at least one of initial pulse value, incremental pulse value, or pulse width.

12. The flash storage system according to claim 7, wherein the projected life value for a respective flash memory device is associated with each flash memory block on the respective flash memory device, and
wherein the projected life value is a number of program-erase cycles expected to be performed on flash memory blocks in the corresponding flash memory device before failure of the flash memory blocks in the corresponding flash memory device.

13. A non-transitory machine-readable media encoded with executable instructions which, when executed by a processor, cause the processor to perform operations comprising:
receiving a command for a data operation;
determining operating parameters for one of a plurality of flash memory devices having a flash memory block associated with the data operation, wherein each of the plurality of flash memory devices has a projected life value, wherein at least two of the plurality of flash memory devices have different projected life values, wherein the operating parameters are determined based on a comparison of the respective projected life value for the one of the plurality of flash memory devices and an average projected life value determined based on the projected life values of the plurality of flash memory devices, and wherein the projected life value for the one of the plurality of flash memory devices is based on a number of voltage pulses applied at a maximum voltage controllable by the one of the plurality of flash memory devices for cells of a test flash memory block in the one of the plurality of flash memory devices to reach a saturation point;
configuring the one of the plurality of flash memory devices based on the determined operating parameters; and
executing the data operation on the one of the plurality of flash memory devices.

14. The non-transitory machine-readable media according to claim 13, wherein each of the plurality of flash memory devices has operating parameters, wherein the at least two of the plurality of flash memory devices have different operating parameters and wherein the at least two of the plurality of flash memory devices include the one of the plurality of flash memory devices.

15. The non-transitory machine-readable media according to claim 14, wherein the difference in the operating parameters corresponds to a difference between the respective projected life values for the at least two of the plurality of memory devices.

16. The non-transitory machine-readable media according to claim 13, wherein the operating parameters comprise erase operation parameters for erasing data units in the plurality of flash memory devices, and wherein the erase operation parameters comprise at least one of initial pulse value, incremental pulse value, or pulse width.

17. The non-transitory machine-readable media according to claim 13, wherein the operating parameters comprise write operation parameters for writing data to data units in the plurality of flash memory devices, and wherein the write operation parameters comprise at least one of initial pulse value, incremental pulse value, or pulse width.

18. The non-transitory machine-readable media according to claim 13, wherein the projected life value for a respective flash memory device is associated with each flash memory block on the respective flash memory device, and wherein the projected life value is a number of program-erase cycles expected to be performed on flash memory blocks in the corresponding flash memory device before failure of the flash memory blocks in the corresponding flash memory device.

\* \* \* \* \*